United States Patent
Hong (10) Patent No.: US 11,003,389 B2
(45) Date of Patent: May 11, 2021

(54) MEMORY DEVICE INCLUDING MEMORY CHIPS AND OPERATION METHOD THEREOF

(71) Applicant: SK hynix Inc., Gyeonggi-do (KR)

(72) Inventor: Yun-Gi Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 98 days.

(21) Appl. No.: 16/384,702

(22) Filed: Apr. 15, 2019

(65) Prior Publication Data

US 2019/0317699 A1 Oct. 17, 2019

(30) Foreign Application Priority Data

Apr. 16, 2018 (KR) ........................ 10-2018-0043829

(51) Int. Cl.
| | | |
|---|---|---|
| *G11C 7/10* | (2006.01) | |
| *G06F 3/06* | (2006.01) | |
| *G11C 7/22* | (2006.01) | |
| *H01L 25/065* | (2006.01) | |

(52) U.S. Cl.
CPC .......... *G06F 3/0659* (2013.01); *G06F 3/0604* (2013.01); *G06F 3/0679* (2013.01); *G11C 7/222* (2013.01); *H01L 25/0657* (2013.01); *G11C 2207/2254* (2013.01); *H01L 2225/06541* (2013.01)

(58) Field of Classification Search
CPC ..................................................... G11C 7/222
USPC ........................................................ 365/63
See application file for complete search history.

(56) References Cited

U.S. PATENT DOCUMENTS

| | | | |
|---|---|---|---|
| 8,692,561 B2 | 4/2014 | Cordero et al. | |
| 2012/0248438 A1* | 10/2012 | Lung | .................... H01L 25/0657 257/48 |
| 2012/0313647 A1* | 12/2012 | Carpenter | ................ G11C 7/10 324/612 |
| 2015/0109845 A1* | 4/2015 | Stephens, Jr. | .......... G11C 16/30 365/63 |
| 2018/0277175 A1* | 9/2018 | Kondo | ....................... G11C 7/02 |
| 2019/0052268 A1* | 2/2019 | Lee | ........................ G11C 7/1057 |
| 2019/0172509 A1* | 6/2019 | Kang | ...................... G11C 7/222 |
| 2020/0227130 A1* | 7/2020 | Kim | ...................... G11C 29/025 |

FOREIGN PATENT DOCUMENTS

KR 10-1110820 2/2012

\* cited by examiner

*Primary Examiner* — Min Huang
(74) *Attorney, Agent, or Firm* — IP & T Group LLP (57) ABSTRACT

An operating method of a memory device includes: instructing, by a master chip, a first memory chip and a second memory chip to perform a read operation; transferring, by the first memory chip, data stored in the first memory chip to the master chip through a first through-chip channel in response to the read operation instruction, and transferring, by the second memory chip, data stored in the second memory chip to the master chip through a second through-chip channel in response to the read operation instruction; comparing, by the master chip, a phase of the data transferred through the first through-chip channel with a phase of the data transferred through the second through-chip channel; and adjusting a delay value of a data transmission channel of at least one of the first memory chip and the second memory chip based on a result of the comparing.

17 Claims, 3 Drawing Sheets

MEMORY DEVICE INCLUDING MEMORY CHIPS AND OPERATION METHOD THEREOF

CROSS-REFERENCE TO RELATED APPLICATION

This application claims priority under 35 U.S.C. § 119 to Korean Patent Application No. 10-2018-0043829, filed on Apr. 16, 2018, the disclosure of which is incorporated herein by reference in its entirety.

BACKGROUND

1. Field

Various embodiments of the present invention generally relate to a memory device. Particularly, the embodiments relate to a memory device including a plurality of memory chips and an operation method thereof.

2. Discussion of the Related Art

Recently, the capacity and speed of memory devices used as memories in most electronic systems have continued to increase. Various attempts have been made to mount more memories in a smaller area and efficiently operate the memories.

In addition, in order to improve the integration of memories, three-dimensional (3D) layout technology, in which a plurality of memory chips are stacked, has been adopted in place of two-dimensional (2D) layout technology. As demand for higher integration and larger capacity of memories continues, there is a need to increase capacity and concurrently reduce the size of semiconductor chips to improve integration using the 3D layout technology of memory chips.

As part of the 3D layout technology, a through-silicon via (TSV) scheme, has been adopted as an alternative for overcoming various limitations such as reduced transmission speed due to distance from a controller to a module, narrow data bandwidth, and reduced transmission speed generated according to a variable on a package. According to the TSV scheme, channels are defined to pass through a plurality of stacked memory chips, and the memory chips communicate with each other through the channels by forming electrodes in the channels.

SUMMARY

Various embodiments of the present invention are directed to technology compensating for a timing skew between memory chips in a memory device.

In an embodiment, an operating method of a memory device including a master chip, a first memory chip stacked on the master chip, and a second memory chip stacked on the first memory chip may include: instructing, by the master chip, the first memory chip and the second memory chip to perform a read operation; transferring, by the first memory chip, data stored in the first memory chip to the master chip through a first through-chip channel in response to the read operation instruction, and transferring, by the second memory chip, data stored in the second memory chip to the master chip through a second through-chip channel in response to the read operation instruction; comparing, by the master chip, a phase of the data transferred through the first through-chip channel with a phase of the data transferred through the second through-chip channel; and adjusting a delay value of a data transmission channel of at least one of the first memory chip and the second memory chip based on a result of the comparing.

In an embodiment, a memory device may include: a first memory chip suitable for transmitting read data thereof to a first through-chip channel during a calibration operation; a second memory chip suitable for transmitting read data thereof to a second through-chip channel during the calibration operation; and a master chip suitable for instructing the first memory chip and the second memory chip to simultaneously perform a read operation during the calibration operation, and adjusting a data transmission timing skew between the first memory chip and the second memory chip by comparing a phase of the data transmitted to the first through-chip channel with a phase of the data transmitted to the second through-chip channel.

In an embodiment, an operating method of a memory device including a master layer, a first memory layer stacked on the master layer, and a second memory layer stacked on the first memory layer may include: setting, by the master layer, the first memory layer and the second memory layer to a calibration mode; simultaneously writing, by the master layer, data in the first and second memory layers; instructing, by the master layer, the first memory layer and the second memory layer to simultaneously read the respective data; receiving, by the master layer, the data read from the first memory layer through a first channel, and receiving, by the master layer, the data read from the second memory layer through a second channel; comparing, by the master layer, a phase of the data received through the first channel with a phase of the data received through the second channel; and adjusting, by the master layer, a delay value of a data transmission channel of at least one of the first memory layer and the second memory layer based on a comparison result during the comparing.

Wherein the adjusting operation may be performed to minimize timing skew between the data read from the first memory layer through the first channel and the data read from the second memory layer through the second channel.

DETAILED DESCRIPTION

Various embodiments of the present invention will be described in detail. However, the present invention is not limited to the embodiments disclosed but can be implemented in various other forms. The following embodiments are described in order to enable those skilled in the art to practice the present invention. To clearly describe the present invention, parts not relating to the description are omitted from the drawings. It should be noted that when denoting parts in the drawing by reference numerals, the same reference numerals refer to the same or like parts throughout the drawings. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

Hereinafter, the various embodiments of the present invention will be described in detail with reference to the attached drawings.

Figure 1A:
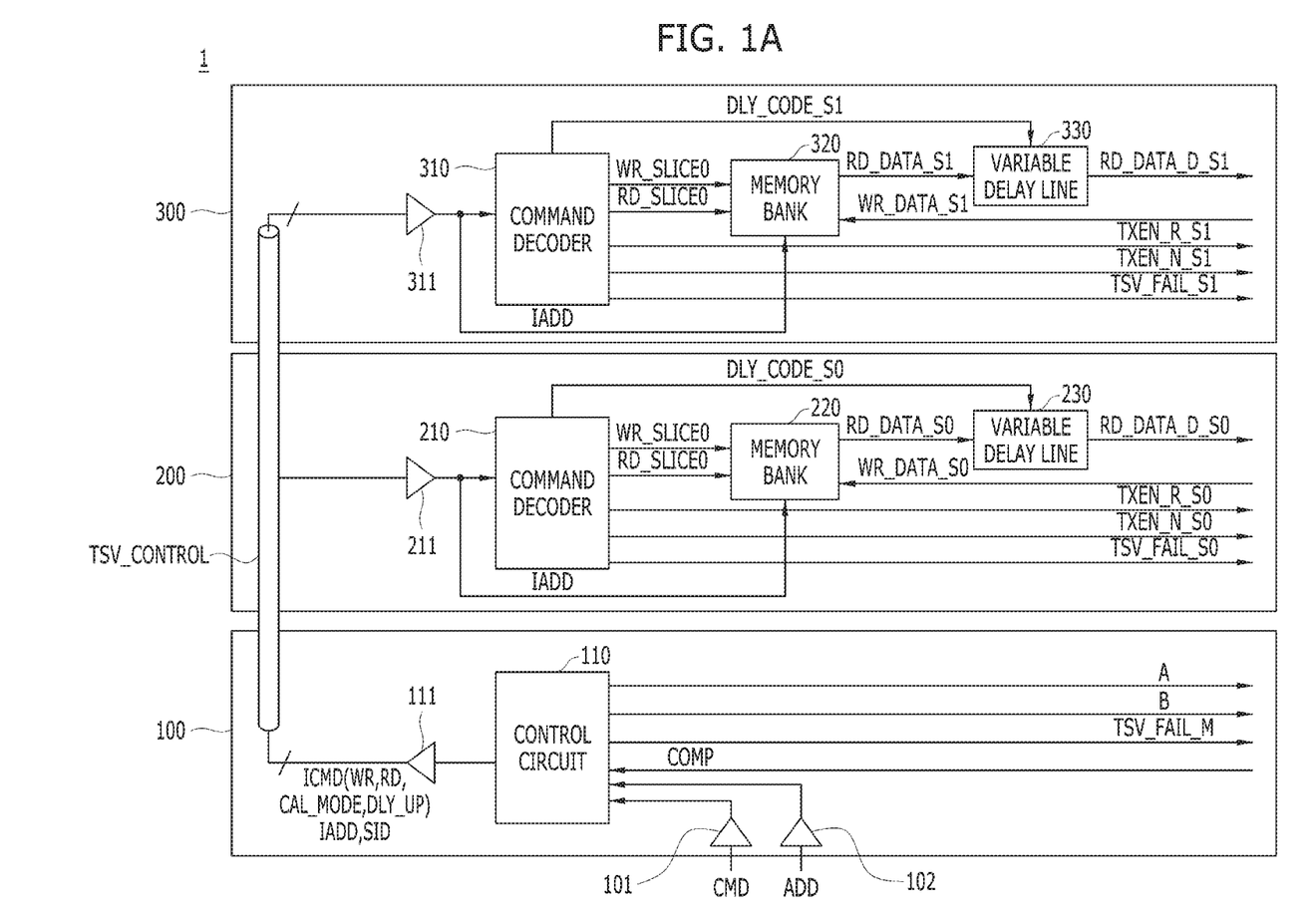
FIGS. 1A and 1B are diagrams illustrating a memory device 1 in accordance with an embodiment of the present invention.
Figure 1B:
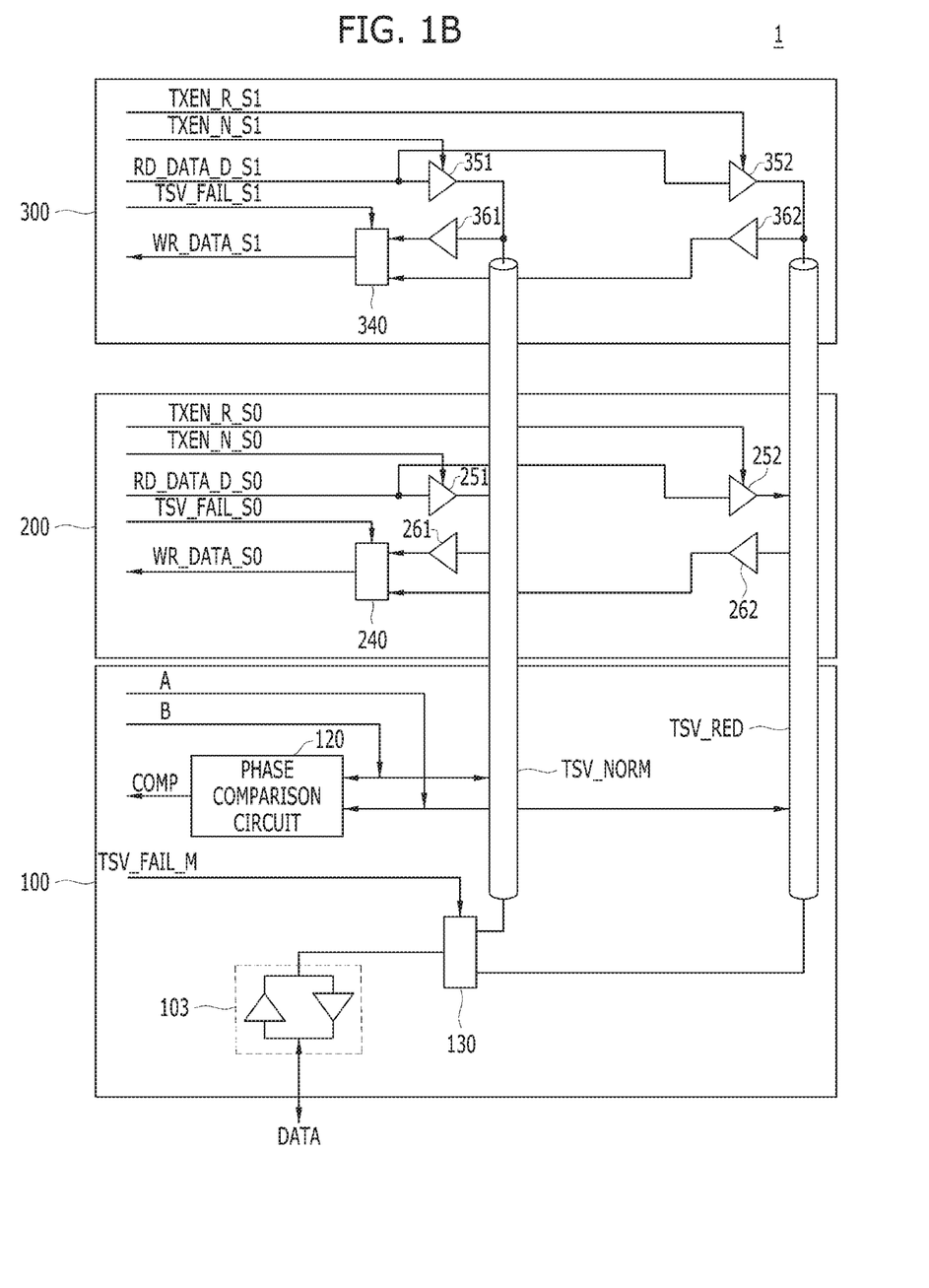

FIGS. 1A and 1B are diagrams illustrating a memory device 1 in accordance with an embodiment of the present invention. Since it is difficult to illustrate the memory device 1 in one drawing, components of the memory device 1 are divided and illustrated in FIGS. 1A and 1B.

Referring to FIGS. 1A and 1B, the memory device 1 may include a master chip 100, a first memory chip 200, a second memory chip 300, control interlayer channels TSV_CONTROL, a first interlayer or through-chip channel TSV_NORM, and a second interlayer or through-chip channel TSV_RED. The first memory chip 200 and the second memory chip 300 may be stacked on the master chip 100. Among the stacked chips, the first memory chip 200 and the second memory chip 300 may function to store data, and the master chip 100 may function as an interface for the first memory chip 200 and the second memory chip 300. The TSV scheme may be through layers, chips, or other circuit constructions.

The master chip 100 may include a command reception circuit 101, an address reception circuit 102, a data transmission and reception circuit 103, a control circuit 110, a phase comparison circuit 120, a selector 130, and a transmission circuit 111.

The command reception circuit 101 of the master chip 100 may receive a command CMD transferred to the memory device 1 from a memory controller (not shown), and may transfer the received command CMD to the control circuit 110. The address reception circuit 102 may receive an address ADD transferred to the memory device 1 from the memory controller and may transfer the received address ADD to the control circuit 110. Each of the command CMD and the address ADD may be a multi-bit.

The data transmission and reception circuit 103 may transmit and receive data DATA to and from the memory controller, and may transfer and receive the transmitted and received data DATA to and from the selector 130.

The control circuit 110 may generate an internal command ICMD, an internal address IADD, and a slice ID (SID), i.e., a chip ID, by using the command CMD transferred through the command reception circuit 101 and the address ADD transferred through the address reception circuit 102. The control circuit 110 may transfer an internal command ICMD to the first memory chip 200 and the second memory chip 300 for operation of the first and second memory chips 200, 300. The internal command ICMD may include a write command WR, a read command RD, a calibration mode setting command CAL_MODE, and a delay increase command DLY_UP. In addition, the control circuit 110 may generate the internal address IADD and the slice ID (SID) by using the address ADD transferred through the address reception circuit 102, and may transfer the internal address IADD and the slice ID (SID) to the first memory chip 200 and the second memory chip 300. Some bits of the address ADD may be used to generate the slice ID (SID), and the remaining bits may be used to generate the internal address IADD.

The control circuit 110 may control a calibration operation for compensating for a timing skew of a read operation between the first memory chip 200 and the second memory chip 300 during an initialization operation of the memory device 1. The calibration operation may be started and controlled by the control circuit 110, irrespective of control of the memory controller, i.e., irrespective of the command CMD and the address ADD.

The transmission circuit 111 may transmit the internal command ICMD, the internal address IADD, and the slice ID (SID) output from the control circuit 110 to the control interlayer channels TSV_CONTROL. One transmission circuit 111 and one control interlayer channel TSV_CONTROL are illustrated in the drawings. However, since each of the internal command ICMD, the internal address IADD, and the slice ID (SID) is multi-bit, a plurality of transmission circuits 111 and a plurality of control interlayer channels TSV_CONTROL may be provided so as to transmit the internal command ICMD, the internal address IADD, and the slice ID (SID). Each of the control interlayer channels TSV_CONTROL may have a through-silicon via.

When a fail signal TSV_FAIL_M is inactivated, the selector 130 may electrically connect the first interlayer channel TSV_NORM to the data transmission and reception circuit 103. When the fail signal TSV_FAIL_M is activated, the selector 130 may electrically connect the second interlayer channel TSV_RED to the transmission and reception circuit 103. The first interlayer channel TSV_NORM may be for transmitting and receiving data between the master chip 100 and the first memory chip 200 and between the master chip 100 and the second memory chip 300. When failure of the first interlayer channel TSV_NORM is determined, the second interlayer channel TSV_RED may act as a redundant interlayer channel for transmitting and receiving data by replacing the first interlayer channel TSV_NORM in the event of its failure. The fail signal TSV_FAIL_M may be a signal activated when the first interlayer channel TSV_NORM fails. The fail signal TSV_FAIL_M may be generated by the control circuit 110.

The phase comparison circuit 120 may compare a phase of read data received through the first interlayer channel TSV_NORM with a phase of read data received through the second interlayer channel TSV_RED during a calibration operation and may transfer a comparison result COMP to the control circuit 110.

The first memory chip 200 may include a command decoder 210, reception circuits 211, a memory bank 220, a variable delay line 230, a selector 240, transmission circuits 251 and 252, and reception circuits 261 and 262.

The reception circuits 211 may receive the internal command ICMD, the internal address IADD, and the slice ID (SID) from the control interlayer channels TSV_CONTROL. The command decoder 210 may decode the internal command ICMD, the internal address IADD, and the slice ID (SID) received by the reception circuits 211 to control other components inside the first memory chip 200. A write signal WR_S0 may be a signal activated during a write operation of the first memory chip 200, and a read signal RD_S0 may be a signal activated during a read operation of the first memory chip 200. A delay code DLY_CODE_S0 may be a code for adjusting a delay value of the variable delay line 230. The fail signal TSV_FAIL_M may be activated when failure of the first TSV TSV_NORM is determined. Transmission activation signals TXEN_N_S0 and TXEN_R_S0 may be signals for activating the transmission circuits 251 and 252.

The memory bank 220 may include a plurality of memory cells and may perform a write operation and the read operation in response to the write signal WR_S0 and the read signal RD_S0. The internal address IADD may be used to select memory cells in which the write operation and the read operation are to be performed in the memory bank 220.

The variable delay line 230 may delay data RD_DATA_S0 read from the memory bank 220 and may transmit the delayed data RD_DATA_S0 to the transmission circuits 251 and 252. A delay value of the variable delay line 230 may be adjusted by the delay code DLY_CODE_S0.

The transmission circuits 251 and 252 may be activated by the transmission activation signals TXEN_N_S0 and TXEN_R_S0. When the transmission circuit 251 is activated, read data RD_DATA_D_S0 delayed by the variable delay line 230 may be transmitted to the first TSV TSV_NORM by the transmission circuit 251, and when the transmission circuit 252 is activated, the read data RD_DATA_D_S0 delayed by the variable delay line 230 may be transmitted to the second interlayer channel TSV_RED by the transmission circuit 252.

The reception circuit 261 may receive data of the first TSV TSV_NORM, and the reception circuit 262 may receive data of the second interlayer channel TSV_RED. When the fail signal TSV_FAIL_S0 is inactivated, the selector 240 may select the data received by the reception circuit 261 and may transfer the selected data to the memory bank 220 as write data WR_DATA_S0, and when the fail signal TSV_FAIL_S0 is activated, the selector 240 may select the data received by the reception circuit 262 and may transfer the received data to the memory bank 220 as write data WR_DATA_S0.

The second memory chip 300 may include a command decoder 310, reception circuits 311, a variable delay line 330, a selector 340, transmission circuits 351 and 352, and reception circuits 361 and 362 as in the first memory chip 200. Since the second memory chip 300 is configured the same as the first memory chip 200, a detailed description of the second memory chip 300 will be omitted. A memory chip to perform a read operation and a write operation may be selected from the first memory chip 200 and the second memory chip 300 by the slice ID (SID).

Operations of the memory device 1 are described below.

Write Operation in a Normal Mode

Here, normal mode means a case in which a calibration mode is not set. Here, operations are described in the context in which the first interlayer channel TSV_NORM is not determined to have failed and the second memory chip 300 is selected from the first memory chip 200 and the second memory chip 300 so as to perform a write operation.

A write operation is started when the memory controller instructs the write operation through the command CMD and designates a position in which the write operation is performed through the address ADD. When the write operation is instructed through the command CMD, the control circuit 110 of the master chip 100 may instruct the first memory chip 200 and the second memory chip 300 to perform the write operation by using the internal command ICMD. That is, a write command WR may be transferred by using the internal command ICMD. Some bits of the address ADD may be used to generate the slice ID (SID), and the remaining bits may be used to generate the internal address IADD. The internal command ICMD, the slice ID (SID), and the internal address IADD may be transferred to the first memory chip 200 and the second memory chip 300 through the control interlayer channels TSV_CONTROL. Since the first interlayer channel TSV_NORM is not determined to have failed, the fail signal TSV_FAIL_M may be inactivated, and data received by the data transmission and reception circuit 103 may be transferred to the first interlayer channel TSV_NORM by the selector 130.

Since the command decoder 210 of the first memory chip 200 recognizes that the write operation is instructed through the internal command ICMD but recognizes that the first memory chip 200 is not selected through the slice ID, the command decoder 210 may inactivate the write signal WR_S0.

Since the command decoder 310 of the second memory chip 300 recognizes that the write operation is instructed through the internal command ICMD and recognizes that the second memory chip 300 is selected through the slice ID (SID), the command decoder 310 may activate a write signal WR_S1. Since the first interlayer channel TSV_NORM is not determined to have failed, the fail signal TSV_FAIL_S1 may be inactivated, and the selector 340 may select data received through the first interlayer channel TSV_NORM by the reception circuits 361 and may transfer the selected data to the memory bank 320. The memory bank 320 may perform a write operation in response to the activated write signal WR_S1. Write data WR_DATA_S1 received from the selector 340 may be written in a memory cell designated by the internal address IADD during the write operation of the memory bank 320.

As described above, during the write operation in the normal mode, a memory chip selected from the first memory chip 200 and the second memory chip 300 may perform the write operation. When the first interlayer channel TSV_NORM is normal, write data is transferred by using the first interlayer channel TSV_NORM, and when the first interlayer channel TSV_NORM fails, write data may be transferred by using the second interlayer channel TSV_RED.

Read Operation in a Normal Mode

Here, operations will be described in the context of the first interlayer channel TSV_NORM having failed and the first memory chip 200 is selected from the first memory chip 200 and the second memory chip 300 so as to perform a read operation.

A read operation is started when the memory controller instructs the read operation through the command CMD and designates a position in which the read operation is performed, through the address ADD. When the read operation is instructed through the command CMD, the control circuit 110 of the master chip 100 may instruct the first memory chip 200 and the second memory chip 300 to perform the read operation, by using the internal command ICMD. That is, a read command RD may be transferred by using the internal command ICMD. Some bits of the address ADD may be used to generate the slice ID (SID), and the remaining bits may be used to generate the internal address IADD. The internal command ICMD, the slice ID (SID), and the internal address IADD may be transferred to the first memory chip 200 and the second memory chip 300 through the control interlayer channels TSV_CONTROL. On the other hand, since the first interlayer channel TSV_NORM is determined to have failed, the fail signal TSV_FAIL_M may be activated, and the selector 130 may electrically connect the second interlayer channel TSV_RED and the transmission and reception circuit 103.

Since the command decoder 310 of the second memory chip 300 recognizes that the read operation is instructed through the internal command ICMD but recognizes that the second memory chip 300 is not selected through the slice ID, the command decoder 310 may inactivate a read signal RD_S1. The fail signal TSV_FAIL_M may be activated, and the transmission activation signals TXEN_N_S1 and TXEN_R_S1 may be inactivated.

Since the command decoder 210 of the first memory chip 200 recognizes that the read operation is instructed through the internal command ICMD and recognizes that the first memory chip 200 is selected through the slice ID (SID), the command decoder 210 may activate the read signal RD_S0. Since the first interlayer channel TSV_NORM has failed and the second interlayer channel TSV_RED needs to be used instead of the first interlayer channel TSV_NORM, the transmission activation signal TXEN_N_S0 may be inactivated, and the transmission activation signal TXEN_R_S0 may be activated. The memory bank 220 may perform the read operation in response to the activated read signal RD_S0. Read data RD_DATA_S0 may be read and output from a memory cell designated by the internal address IADD during the read operation of the memory bank 220. The read data RD_DATA_S0 may be delayed by the variable delay line 230, and delayed read data RD_DATA_D_S0 may be transmitted to the second interlayer channel TSV_RED through the transmission circuit 252. The transmission and reception circuit 103 of the master chip 100 may transfer data of the second interlayer channel TSV_RED to the memory controller outside the memory device 1.

As described above, during the read operation in the normal mode, a memory chip selected from the first memory chip 200 and the second memory chip 300 may perform the read operation. When the first interlayer channel TSV_NORM is normal, read data is transferred by using the first interlayer channel TSV_NORM, and when the first interlayer channel TSV_NORM fails, read data may be transferred by using the second interlayer channel TSV_RED.

Calibration Operation

A calibration operation may be performed by the control circuit 110 of the master chip 100. The calibration operation may mean an operation of compensating for a timing skew during a read operation of the first memory chip 200 and the second memory chip 300. The calibration operation may be performed during initialization of the memory device 1. The calibration operation may include (1) setting a calibration mode, (2) performing a write operation in the calibration mode, (3) performing a read operation in the calibration mode, and (4) performing a compensation operation to adjust timing skew between the first memory chip 200 and the second memory chip 300.

(1) Setting a Calibration Mode

The control circuit 110 may instruct the first memory chip 200 and the second memory chip 300 to set a calibration mode. That is, a calibrate mode setting command CAL_MODE may be transferred by using the internal command ICMD. The command decoder 210 of the first memory chip 200 may decode the internal command ICMD to set the first memory chip 200 to the calibration mode, and the command decoder 310 of the second memory chip 300 may decode the internal command ICMD to set the second memory chip 300 to the calibration mode.

In the calibration mode, the first memory chip 200 may be set to use the first interlayer channel TSV_NORM. The fail signal TSV_FAIL_S0 may be maintained in an inactivated state, and in the write operation, the transmission activation signal TXEN_N_S0 may be activated and the transmission activation signal TXEN_R_S0 may be inactivated. In addition, in the calibration mode, the first memory chip 200 may perform a "don't care" operation on the slice ID (SID) during read and write operations. That is, in the calibration mode, regardless of the slice ID (SID) value, the first memory chip 200 may be selected to perform read and write operations.

In the calibration mode, the second memory chip 300 may be set to use the second interlayer channel TSV_RED. The fail signal TSV_FAIL_S1 may be maintained in an activated state, and in the write operation, the transmission activation signal TXEN_N_S1 may be activated and the transmission activation signal TXEN_R_S1 may be inactivated. In addition, in the calibration mode, the second memory chip 300 may perform a "don't care" operation on the slice ID (SID) during read and write operations. That is, in the calibration mode, even when the slice ID (SID) has any value, the second memory chip 300 may be selected to perform read and write operations.

(2) Performing a Write Operation in the Calibration Mode

The control circuit 110 may instruct the first memory chip 200 and the second memory chip 300 to perform a write operation. That is, the write command WR may be transferred by using the internal command ICMD. Position A, at which a write operation is performed, may be designated by using the internal address IADD. The control circuit 110 may transfer data (for example, "0") to be written in the first memory chip 200 to the first interlayer channel TSV_NORM and may transfer data (for example, "0") to written in the second memory chip 300 to the second interlayer channel TSV_RED.

Since the command decoder 210 of the first memory chip 200 recognizes that the write operation is instructed through the internal command ICMD and the slice ID (SID) is in a "don't care" state during the write operation in the calibration mode, the command decoder 210 recognizes that the first memory chip 200 is selected to perform the write operation. Therefore, the write signal WR_S0 may be activated. Since the fail signal TSV_FAIL_S0 is in an inactivated state, the selector 240 may select data received through the first interlayer channel TSV_NORM by the reception circuit 261 and may transfer the selected data to the memory bank 220. The memory bank 220 may perform the write operation in response to the activated write signal WR_S0. During the write operation of the memory bank 220, the write data WR_DATA_S0 received through the first interlayer channel TSV_NORM, i.e., "0" may be written in a memory cell at position A designated by the internal address IADD.

Since the command decoder 310 of the second memory chip 300 recognizes that the write operation is instructed through the internal command ICMD and the slice ID (SID) is in a "don't care" state during the write operation in the calibration mode, the command decoder 310 recognizes that the second memory chip 300 is selected to perform the write operation. Therefore, the write signal WR_S1 may be activated. Since the fail signal TSV_FAIL_S1 is in an activated state, the selector 340 may select data received through the second interlayer channel TSV_RED by the reception circuit 262 and may transfer the selected data to the memory bank 320. The memory bank 320 may perform the write operation in response to the activated write signal WR_S1. During the write operation of the memory bank 320, the write data WR_DATA_S1 received through the second interlayer channel TSV_RED, i.e., "0" may be written in a memory cell at position A designated by the internal address IADD.

The control circuit 110 may reinstruct the first memory chip 200 and the second memory chip 300 to perform a write operation. That is, the write command WR may be transferred by using the internal command ICMD. In addition, position B, at which a write operation is performed, may be designated by using the internal address IADD. The control circuit 110 may transfer data (for example, "1"), to be written in the first memory chip 200, to the first interlayer channel TSV_NORM and may transfer data (for example, "1"), to be written in the second memory chip 300, to the second interlayer channel TSV_RED.

Since the command decoder 210 of the first memory chip 200 recognizes that the write operation is instructed through the internal command ICMD and the slice ID (SID) is in a "don't care" state during the write operation in the calibration mode, the command decoder 210 recognizes that the first memory chip 200 is selected to perform the write operation. Therefore, the write signal WR_S0 may be activated. Since the fail signal TSV_FAIL_S0 is in an inactivated state, the selector 240 may select data received through the first interlayer channel TSV_NORM by the reception circuit 261 and may transfer the selected data to the memory bank 220. The memory bank 220 may perform the write operation in response to the activated write signal WR_S0. During the write operation of the memory bank 220, the write data WR_DATA_S0 received through the first interlayer channel TSV_NORM, i.e., "1", may be written in a memory cell at position B designated by the internal address IADD.

Since the command decoder 310 of the second memory chip 300 recognizes that the write operation is instructed through the internal command ICMD and the slice ID (SID) is in a "don't care" state during the write operation in the calibration mode, the command decoder 310 recognizes that the second memory chip 300 is selected to perform the write operation. Therefore, the write signal WR_S1 may be activated. Since the fail signal TSV_FAIL_S1 is in an activated state, the selector 340 may select data received through the second interlayer channel TSV_RED by the reception circuit 262 and may transfer the selected data to the memory bank 320. The memory bank 320 may perform the write operation in response to the activated write signal WR_S1. During the write operation of the memory bank 320, the write data WR_DATA_S1 received through the second interlayer channel TSV_RED, i.e., "1", may be written in a memory cell at position B designated by the internal address IADD.

In summary, in the calibration mode, data "0" may be concurrently written at positions A of the first memory chip 200 and the second memory chip 300, and then, data "1" may be concurrently written at positions B of the first memory chip 200 and the second memory chip 300.

(3) Performing a Read Operation in the Calibration Mode

The control circuit 110 may instruct the first memory chip 200 and the second memory chip 300 to perform a read operation. That is, the read command RD may be transferred by using the internal command ICMD. Position A, at which a read operation is performed, may be designated by using the internal address IADD.

Since the command decoder 210 of the first memory chip 200 recognizes that the read operation is instructed through the internal command ICMD and the slice ID (SID) is in a "don't care" state during the read operation in the calibration mode, the command decoder 210 recognizes that the first memory chip 200 is selected to perform the read operation. Therefore, the read signal RD_S0 may be activated. In addition, since the first memory chip 200 uses the first interlayer channel TSV_NORM in the calibration mode, the command decoder 210 may activate the transmission activation signal TXEN_N_S0 and may inactivate the transmission activation signal TXEN_R_S0. The memory bank 220 may perform the read operation in response to the activated read signal RD_S0. During the read operation of the memory bank 220, the data RD_DATA_S0 read from a memory cell at position A designated by the internal address IADD may be transferred to the variable delay line 230, and the data RD_DATA_D_S0 delayed by the variable delay line 230 may be transmitted to the first interlayer channel TSV_NORM through the transmission circuit 251. Since data "0" was written at position A during the previous write operation, data read from position A during the read operation is "0". Read data of the first memory chip 200 transmitted to the first interlayer channel TSV_NORM may be transferred to the phase comparison circuit 120 of the master chip 100.

Since the command decoder 310 of the second memory chip 300 recognizes that the read operation is instructed through the internal command ICMD and the slice ID (SID) is in a "don't care" state during the read operation in the calibration mode, the command decoder 310 recognizes that the second memory chip 300 is selected to perform the read operation. Therefore, the read signal RD_S1 may be activated. In addition, since the second memory chip 300 uses the second interlayer channel TSV_RED in the calibration mode, the command decoder 310 may activate the transmission activation signal TXEN_R_S1 and may inactivate the transmission activation signal TXEN_N_S1. The memory bank 320 may perform the read operation in response to the activated read signal RD_S1. During the read operation of the memory bank 320, data RD_DATA_S1 read from a memory cell at position A designated by the internal address IADD may be transferred to the variable delay line 330, and data RD_DATA_D_S1 delayed by the variable delay line 330 may be transmitted to the second interlayer channel TSV_RED through the transmission circuit 352. Since data "0" was written at position A during the previous write operation, data read from position A during the read operation is "0". Read data of the second memory chip 300 transmitted to the second interlayer channel TSV_RED may be transferred to the phase comparison circuit 120 of the master chip 100.

The control circuit 110 may reinstruct the first memory chip 200 and the second memory chip 300 to perform a read operation. That is, the read command RD may be transferred by using the internal command ICMD. In addition, position B, at which a read operation is performed, may be designated by using the internal address IADD.

Since the command decoder 210 of the first memory chip 200 recognizes that the read operation is instructed through the internal command ICMD and the slice ID (SID) is in a "don't care" state during the read operation in the calibration mode, the command decoder 210 recognizes that the first memory chip 200 is selected to perform the read operation. Therefore, the read signal RD_S0 may be activated. In addition, since the first memory chip 200 uses the first interlayer channel TSV_NORM in the calibration mode, the command decoder 210 may activate the transmission activation signal TXEN_N_S0 and may inactivate the transmission activation signal TXEN_R_S0. The memory bank 220 may perform the read operation in response to the activated read signal RD_S0. During the read operation of the memory bank 220, the data RD_DATA_S0 read from a memory cell at position B designated by the internal address IADD may be transferred to the variable delay line 230, and the data RD_DATA_D_S0 delayed by the variable delay line 230 may be transmitted to the first interlayer channel TSV_NORM through the transmission circuit 251. Since data "1" was written at position B during the previous write operation, data read from position B during the read operation is "1". Read data of the first memory chip 200 transmitted to the first interlayer channel TSV_NORM may be transferred to the phase comparison circuit 120 of the master chip 100.

Since the command decoder 310 of the second memory chip 300 recognizes that the read operation is instructed through the internal command ICMD and the slice ID (SID) is in a "don't care" state during the read operation in the calibration mode, the command decoder 310 recognizes that the second memory chip 300 is selected to perform the read operation. Therefore, the read signal RD_S1 may be activated. In addition, since the second memory chip 300 uses the second interlayer channel TSV_RED in the calibration mode, the command decoder 310 may activate the transmission activation signal TXEN_R_S1 and may inactivate the transmission activation signal TXEN_N_S1. The memory bank 320 may perform the read operation in response to the activated read signal RD_S1. During the read operation of the memory bank 320, the data RD_DATA_S1 read from a memory cell at position B designated by the internal address IADD may be transferred to the variable delay line 330, and the data RD_DATA_D_S1 delayed by the variable delay line 330 may be transmitted to the second interlayer channel TSV_RED through the transmission circuit 352. Since data "1" was written at position B during the previous write operation, data read from position B during the read operation is "1". Read data of the second memory chip 300 transmitted to the second interlayer channel TSV_RED may be transferred to the phase comparison circuit 120 of the master chip 100.

In summary, in the calibration mode, pieces of data "0" stored at positions A of the first memory chip 200 and the second memory chip 300 may be read at the same time and may be transferred to the phase comparison circuit 120 of the master chip 100, and then, pieces of data "1" stored at positions B of the first memory chip 200 and the second memory chip 300 may be read at the same time and may be transferred to the phase comparison circuit 120 of the master chip 100.

(4) Performing a Compensation Operation of a Timing Skew Between the First Memory Chip 200 and the Second Memory Chip 300.

As described in operation (3), during the read operation in the calibration mode, the pieces of data "0" are concurrently read from the first memory chip 200 and the second memory chip 300 and are transferred to the phase comparison circuit 120 of the master chip 100, and then, the pieces of data "1" are concurrently read from the first memory chip 200 and the second memory chip 300 and transferred to the phase comparison circuit 120 of the master chip 100. The phase comparison circuit 120 may compare a time at which data read from the first memory chip 200 transitions from "0" to "1" with a time at which data read from the second memory chip 300 transitions from "0" to "1" and may transfer a comparison result COMP to the control circuit 110.

When the comparison result COMP of the phase comparison circuit 120 indicates that a phase of the data read from the first memory chip 200 leads a phase of the data read from the second memory chip 300, i.e., when the time at which the data read from the first memory chip 200 transitions from "0" to "1" leads the time at which the data read from the second memory chip 300 transitions from "0" to "1", the control circuit 110 may determine that the read data of the first memory chip 200 is transferred faster to the master chip 100, compared to the read data of the second memory chip 300. Therefore, the control circuit 110 may transfer a delay increase command DLY_UP through the internal command ICMD and may select the first memory chip 200 through the slice ID (SID). The command decoder 210 of the first memory chip 200 may increase a delay value of the variable delay line 230 by increasing the delay code DLY_CODE_S0. When the delay value of the variable delay line 230 is increased, the difference between the time at which the data read from the first memory chip 200 is transferred to the master chip 100 and the time at which the data read from the second memory chip 300 is transferred to the master chip 100 may be decreased.

When the comparison result COMP of the phase comparison circuit 120 indicates that the phase of the data read from the second memory chip 300 leads the phase of the data read from the first memory chip 200, i.e., when the time at which the data read from the second memory chip 300 transitions from "0" to "1" leads the time at which the data read from the first memory chip 200 transitions from "0" to "1", the control circuit 110 may determine that the read data of the second memory chip 300 is transferred faster to the master chip 100, compared to the read data of the first memory chip 200. Therefore, the control circuit 110 may transfer the delay increase command DLY_UP through the internal command ICMD and may select the second memory chip 300 through the slice ID (SID). The command decoder 310 of the second memory chip 300 may increase a delay value of the variable delay line 330 by increasing a delay code DLY_CODE_S1. When the delay value of the variable delay line 330 is increased, the difference between the time at which the data read from the second memory chip 300 is transferred to the master chip 100 and the time at which the data read from the first memory chip 200 is transferred to the master chip 100 may be decreased.

In summary, the phase comparison circuit 120 compares the phase of the data read from the first memory chip 200 with the phase of the data read from the second memory chip 300, and may increase a delay value of a memory chip of the memory chip 200 or 300 from which read data is transferred faster. Therefore, the difference between the transfer time of the read data of the first memory chip 200 and the transfer time of the read data of the second memory chip 300 may be decreased. Here, timing compensation between the first memory chip 200 and the second memory chip 300 has been described by way of example through a delay value increase method. However, the invention is not so limited. The timing skew between the first memory chip 200 and the second memory chip 300 may be compensated for through a delay value decrease method. That is, the phase comparison circuit 120 compares the phase of the data read from the first memory chip 200 with the phase of the data read from the second memory chip 300, and may decrease a delay value of the memory chip (first 200 or second 300) from which read data is more slowly transferred.

Figure 2:
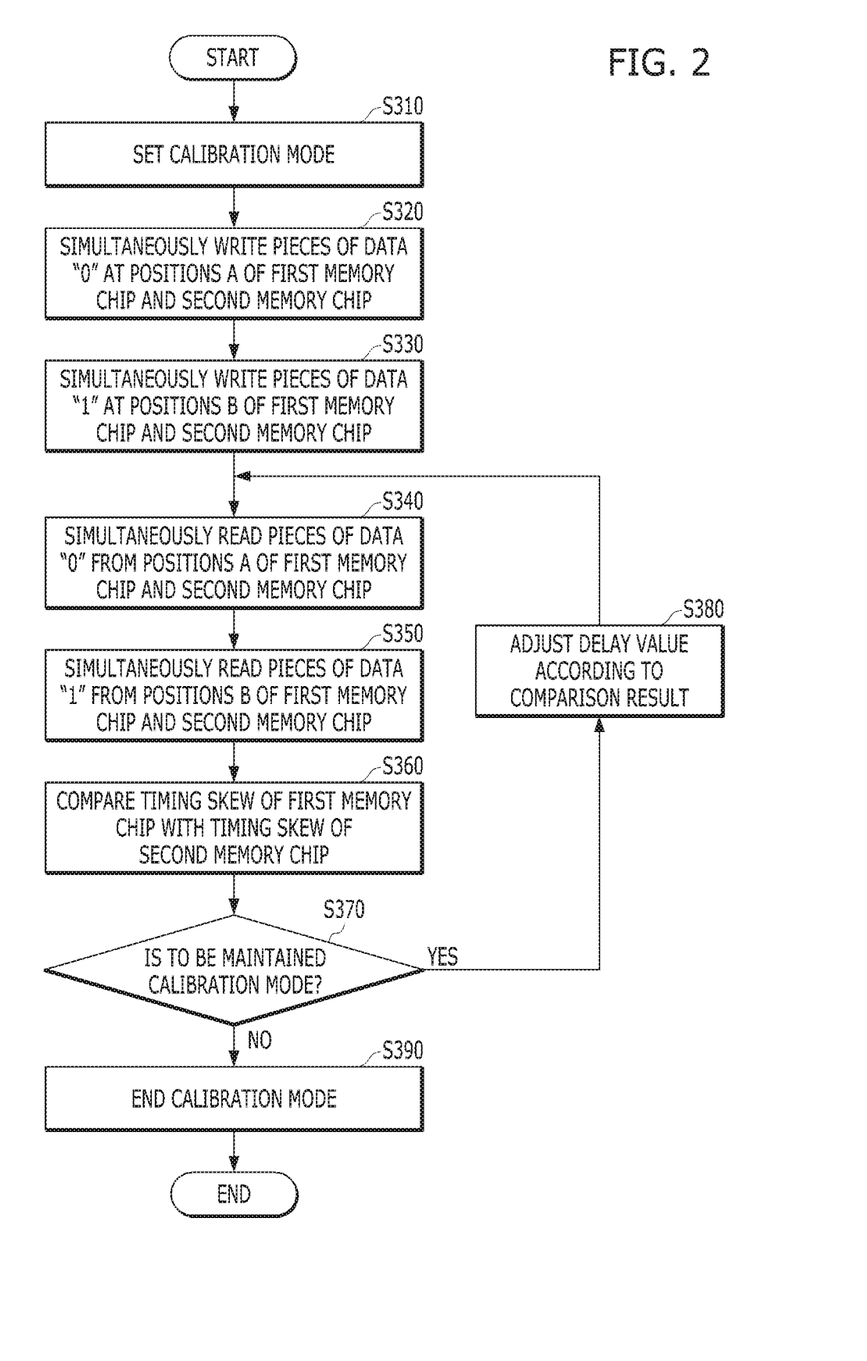
FIG. 2 is a flowchart illustrating a calibration operation of a memory device in accordance with an embodiment of the present invention.

FIG. 2 is a flowchart illustrating a calibration operation of a memory device in accordance with an embodiment of the present invention. For example, the memory device may be the memory device 1 of FIGS. 1A and 1B.

Referring to FIG. 2, a calibration mode may be set during an initialization operation of the memory device 1, at step S310.

After the calibration mode is set, pieces of data "0" may be simultaneously written at positions A of the first memory chip 200 and the second memory chip 300 at step S320. Pieces of data "1" may be simultaneously written to positions B of the first memory chip 200 and the second memory chip 300 at step S330.

After the write operation, pieces of data "0" may be simultaneously read from positions A of the first memory chip 200 and the second memory chip 300 at step S340. Pieces of data "1" data may be simultaneously read from positions B of the first memory chip 200 and the second memory chip 300 at step S350.

The phase comparison circuit 120 may compare a transition time of data read from the first memory chip 200 with a transition time of data read from the second memory chip 300 at step S360. The transition time may be the time it takes to transition from one logic level, i.e., "0" to the other logic level, i.e., "1" or vice versa.

The control circuit 110 may determine whether to maintain the calibration mode at step S370. For example, when the comparison result COMP of the phase comparison circuit 120 is the same as a previous comparison result, the control circuit 110 may determine that the timing skew between the first memory chip 200 and the second memory chip 300 still requires compensation or requires more compensation, and may determine to maintain the calibration mode. Further, when the comparison result COMP of the phase comparison circuit 120 is different from a previous comparison result, the control circuit 110 may determine that the timing skew between the first memory chip 200 and the second memory chip 300 is sufficiently compensated for, and may determine not to maintain the calibration mode.

Accordingly, when it is determined that the calibration mode is to be maintained ("YES" in step S370), the control circuit 110 may adjust a delay value of the variable delay line 230 of the first memory chip 200 or a delay value of the variable delay line 330 of the second memory chip 300 according to the comparison result COMP in the operation of step S380. After the delay value is adjusted, the process may return to the operation of step S340.

When it is determined not to maintain the calibration mode ("NO" in S370), the control circuit 110 may end the calibrating mode at step S390, after which the process ends. For example, the calibration mode may be ended by an operation in which the control circuit 110 transfers the calibration mode setting command CAL_MODE again to the first memory chip 200 and the second memory chip 300 as the internal command ICMD.

Thus, a difference between a time at which data of the first memory chip 200 is transferred to the master chip 100 and a time at which data of the second memory chip 300 is transferred to the master chip 100 may be compensated for during a read operation by the calibration operation.

According to embodiments, a timing skew between a plurality of memory chips included in a memory device is compensated.

While the present invention has been described with respect to specific embodiments, the embodiments are not intended to be restrictive, but rather descriptive. Further, as those skilled in the art will recognize, the present invention may be implemented or achieved in various ways through substitution, change, and modification of disclosed embodiments or aspects thereof without departing from the scope of the present invention as defined by the following claims.

What is claimed is:

1. An operating method of a memory device including a master chip, a first memory chip stacked on the master chip, and a second memory chip stacked on the first memory chip, the operating method comprising:
   setting, by the master chip, the first memory chip and the second memory chip to a calibration mode, wherein in the calibration mode, a through-chip channel is set not to fail in the first memory chip and the through-chip channel is set to fail in the second memory chip;
   instructing, by the master chip, the first memory chip and the second memory chip to perform a read operation;
   transferring, by the first memory chip, data stored in the first memory chip to the master chip through the through-chip channel in response to the read operation instruction, and transferring, by the second memory chip, data stored in the second memory chip to the master chip through a redundant through-chip channel for replacing the through-chip channel in response to the read operation instruction;
   comparing, by the master chip, a phase of the data transferred through the through-chip channel with a phase of the data transferred through the redundant through-chip channel; and
   adjusting a delay value of a data transmission channel of at least one of the first memory chip and the second memory chip based on a result of the comparing.

2. The operating method of claim 1, wherein each of the through-chip channel and the redundant through-chip channel includes a through-silicon via (TSV).

3. The operating method of claim 1, wherein the adjusting of the delay value comprises:
   increasing the delay value of the data transmission channel of the first memory chip when the phase of the data transferred through the through-chip channel leads the phase of the data transferred through the redundant through-chip channel; and
   increasing the delay value of the data transmission channel of the second memory chip when the phase of the data transferred through the redundant through-chip channel leads the phase of the data transferred through the through-chip channel.

4. The operating method of claim 1, further comprising, prior to instructing the read operation, writing, by the master chip, data in the first memory chip and the second memory chip.

5. The operating method of claim 1, wherein the instructing, the comparing, and the adjusting are repeated until the result of the comparing of the data phases is changed.

6. A memory device comprising:
   a first memory chip suitable for transmitting read data thereof to a through-chip channel during a calibration operation;
   a second memory chip suitable for transmitting read data thereof to a redundant through-chip channel for replacing the through-chip channel during the calibration operation; and
   a master chip suitable for instructing the first memory chip and the second memory chip to simultaneously perform a read operation during the calibration operation, and adjusting a data transmission timing skew between the first memory chip and the second memory chip by comparing a phase of the data transmitted to the through-chip channel with a phase of the data transmitted to the redundant through-chip channel, wherein, during the calibration operation, the through-chip channel is set to fail in the second memory chip, and the through-chip channel is set not to fail in the first memory chip.

7. The memory device of claim 6, wherein the first memory chip comprises a first variable delay line suitable for delaying the read data of the first memory chip to be transmitted to the through-chip channel, and the second memory chip comprises a second variable delay line suitable for delaying the read data of the second memory chip to be transmitted to the redundant through-chip channel.

8. The memory device of claim 6, wherein the master chip controls the first memory chip to increase a delay value of the first variable delay line when the phase of the data transmitted to the through-chip channel leads the phase of the data transmitted to the redundant through-chip channel, and controls the second memory chip to increase a delay value of the second variable delay line when the phase of the data transmitted to the redundant through-chip channel leads the phase of the data transmitted to the through-chip channel.

9. The memory device of claim 6, wherein each of the through-chip channel and the redundant through-chip channel includes a through-silicon via (TSV).

10. The memory device of claim 6, wherein the calibration operation is performed during an initialization operation of the memory device.

11. The memory device of claim 6, wherein the master chip writes data in the first memory chip and the second memory chip before instructing the first memory chip and the second memory chip to simultaneously perform the read operation.

12. The memory device of claim 6, wherein the first memory chip comprises a first memory bank;
a first variable delay line suitable for delaying the read data read from the first memory bank;
a first transmission circuit suitable for transmitting the read data transferred from the first variable delay line to the through-chip channel; and
a first command decoder suitable for decoding an internal command transmitted from the master chip to control the first memory bank and the first variable delay line.

13. The memory device of claim 6, wherein the second memory chip comprises a second memory bank;
a second variable delay line suitable for delaying the read data read from the second memory bank;
a second transmission circuit suitable for transmitting the read data transferred from the second variable delay line to the redundant through-chip channel; and
a second command decoder suitable for decoding an internal command transmitted from the master chip to control the second memory bank and the second variable delay line.

14. The memory device of claim 6, further comprising a plurality of control through-chip channels suitable for transferring an internal command and an internal address from the master chip to the first memory chip and the second memory chip.

15. The memory device of claim 6, wherein the first memory chip and the second memory chip are sequentially stacked on the master chip.

16. A method of operating a memory device including a master layer, a first memory layer stacked on the master layer, and a second memory layer stacked on the first memory layer, the operating method comprising:
setting, by the master layer, the first memory layer and the second memory layer to a calibration mode, wherein in the calibration mode, a channel is set not to fail in the first memory layer and the channel is set to fail in the second memory layer;
simultaneously writing, by the master layer, data in the first and second memory layers;
instructing, by the master layer, the first memory layer and the second memory layer to simultaneously read the respective data;
receiving, by the master layer, the data read from the first memory layer through the channel, and receiving, by the master layer, the data read from the second memory layer through a redundant channel for replacing the channel;
comparing, by the master layer, a phase of the data received through the channel with a phase of the data received through the redundant channel; and
adjusting, by the master layer, a delay value of a data transmission channel of at least one of the first memory layer and the second memory layer based on a comparison result during the comparing.

17. The method of claim 16, wherein the adjusting operation is performed to minimize timing skew between the data read from the first memory layer through the first channel and the data read from the second memory layer through the redundant channel.

* * * * *